(12) United States Patent
Zrilic (10) Patent No.: US 10,594,335 B1
(45) Date of Patent: Mar. 17, 2020

(54) SQUARE-LAW COMPANDING APPARATUS BASED ON NONLINEAR OPERATIONS ON MODULATED BIT-STREAM

(71) Applicant: Djuro George Zrilic, Santa Fe, NM (US)

(72) Inventor: Djuro George Zrilic, Santa Fe, NM (US)

(73) Assignee: Djuro G. Zrilic, Santa Fe, NM (US)

(*) Notice: Subject to any disclaimer, the term of this patent is extended or adjusted under 35 U.S.C. 154(b) by 0 days.

(21) Appl. No.: 16/350,315

(22) Filed: Nov. 1, 2018

(51) Int. Cl.
H03M 3/00 (2006.01)

(52) U.S. Cl.
CPC .................. H03M 3/438 (2013.01)

(58) Field of Classification Search
CPC ..................................... H03M 3/438
USPC ......................... 341/143, 155, 144
See application file for complete search history.

(56) References Cited

U.S. PATENT DOCUMENTS

| | | | |
|---|---|---|---|
| 4,940,977 A * | 7/1990 | Mandell | H03G 9/005 341/139 |
| 6,587,061 B2 | 7/2003 | Petrofsky | |
| 9,141,339 B2 | 9/2015 | Zrilic | |
| 9,525,430 B1 | 12/2016 | Zrilic | |
| 9,575,729 B1 | 2/2017 | Zrilic | |

OTHER PUBLICATIONS

H. L Sneha, Companding: Logarithmic Laws, Implementation, and Consequences, http://www.allaboutcircuits.com/technical-aricles/companding.
H.L. Sneha, An Introduction to Companding: Compressing Speech for Transmission Across Telephone Systems, http://www.allaboutcircuits.com/technical-aricles/an introduction.
B. Rudolph, Understanding Audio Compressors and Audio Compression, http://www.barryrudolph.com/mix/comp.html.
H. Taub, D. L. Schilling, Principles of Communications Systems, Second Edition, McGraw Hill, 1986, pp. 213-219.
T. Wiltshire, Noise Reduction with Companders, http://electricdruid.net/noise-reduction.
Bucket Brigade Devices: MN3007 (/mn3007-bucket-brigade-devices). Download from Internet.
K. Takasuka et al, A Sigma-Delta based Square-Law Compandor, Proc.CICC, pp. 12.7.1-12.7.4, Boston, MA, 1990.
A. Roy et al, Processing of Communication Signal Using Operational Transconductance Amplifier, Journal of Telecommunications, vol. 1, Issue 1, Feb. 2010, pp. 118-122.
H. Qiuting, Monolitic CMOS Compandors Based on Σ-Δ Oversampling, Proc. Of IEEE ISCAS, 1992, pp. 2649-2651.

(Continued)

Primary Examiner — Peguy Jean Pierre (57) ABSTRACT

Disclosed are four independent circuits for compression, expansion, companding, and post-processing of a compressed delta-sigma bit-stream. Compression and expansion are based on the use of a second-order (or higher-order) delta-sigma modulator, and a nonlinear operation on a delta-sigma modulated bit-stream. Depending on application, the disclosed circuits can operate as a stand-alone integrated circuit, or as compandor apparatus as proposed. Inherited low-pass filter can be digital or analog. Thus, the only external analog component to the IC chip could be a capacitor C, when low-frequency analog signal is compressed or expanded.

4 Claims, 12 Drawing Sheets

(56) References Cited

OTHER PUBLICATIONS

Dj. Zrilic, Circuits and Systems Based on Delta Modulation, Springer, 2005, pp. 174-182.
Dj. Zrilic et al, Novel Solution for a Delta-Sigma-Based Rectifying Encoder, IEEE Tr. On CAS II, vol. 64. No. 10, Oct. 2017.
J. Candy, G. Temes, Editors, Oversampling Delta-Sigma Data Converters, IEEE Press, 1992.
S. Pavan, R. Schrier, G. Temes, Understanding Delta-Sigma Data Converters, IEEE Press, 2017.
W. Wey, Y. Huang, A CMOS Delta-Sigma True RMS Converter, IEEE Tr. On Solid-State Circuits, vol. 35, No. 2, Feb. 2000.
J. Petrofsky, G. Brisebois, Δ-Σ breakthrough: LTC 1966 True RMS-to-DC Converter Uses No Diodes, Heathers or Logarithms, Linear Technology magazine, 2002.
N. Kouvaras, Operations on Delta-Modulated Signals and their Applications in the Realization of Digital Filters, The Radio and Electronic Engineer, vol. 48, No. 9, pp. 431-438, Sep. 1978.
J. Bellamy, Digital Telephony, Second Edition, John Wiley&Sons, ISBN 0-471-62056-4.
H. Taub, D.L. Schilling, Principles of Communication Systems, Second Edition, ISBN 0-07-062955-2.
A.B. Carlson, Communication Systems, Third Edition, Mc Grow Hill, ISBN 0-07-009960-X.

* cited by examiner

FIG. 8
Compander

FIG. 12

SQUARE-LAW COMPANDING APPARATUS BASED ON NONLINEAR OPERATIONS ON MODULATED BIT-STREAM

CROSS REFERENCES TO RELATED APPLICATIONS

Dj. Zrilc, U.S. Pat. No. 9,141,339 B2, Date of Patent: Sep. 22, 2015
Dj. Zrilic, U.S. Pat. No. 9,525,430 B1, Date of Patent: Dec. 20, 2016
Dj. Zrilic, U.S. Pat. No. 9,575,729 B1, Date of Patent: Feb. 21, 2017
J. G. Petrofsky, U.S. Pat. No. 6,587,061 B2, Date of Patent: Jul. 1, 2003
D. E. Mandell, U.S. Pat. No. 4,940,977, Date of Patent: Jul. 10, 1990

STATEMENT REGARDING FEDERALLY SPONSORED R&D

These research results are not sponsored by Government grants.

BACKGROUND OF INVENTION

1. Field of the Invention

The present invention relates to circuits for compression and expansion of analog signals based on delta-sigma modulation ($\Delta$-$\Sigma$M). The combination of compressor and expander is compander (ie, compressor and expander). A proposed companding technique is based on a nonlinear signal processing of a one-bit $\Delta$-$\Sigma$ bit-stream of a second-order $\Delta$-$\Sigma$ modulator. To achieve compression the $\Delta$-$\Sigma$ modulator is highly oversampled, and its pulse stream is nonlinearly processed in the feedback loop of a second order $\Delta$-$\Sigma$ modulator. To achieve expansion an inverse circuit of compressor must be designed (expander). Thus, the field of this invention is non-conventional signal processing based on nonlinear processing of a $\Delta$-$\Sigma$ modulated bit-stream.

2. Description of the Prior Art

There are several publications dealing with companding of analog signals. Most of these publications deal with analog implementation of companding circuits, which are used in telephone transmission systems. In the past six decades pulse code modulation (PCM) is used as an analog-to-digital converter (ADC) in digital telephone systems. The PCM encoding schemes are recommended by International Telecommunication Union (ITU) and are the international PCM companding standards. European countries practice logarithmic A-Law, while logarithmic µ-law companding technique is deployed in North America and Japan. A brief introduction about the need for companding in PCM based digital telephone systems can be found in references [1], [2], [3]. In addition, there are a number of communication books describing in detail the operation of PCM technique [4]. Existing compander systems are composed of complex analog circuits that provide sound quality. However, analog circuits are, by nature, subject to variable performance, and use of advance techniques are required to keep performance levels constant. There are compander integrated circuit (IC) chips on the market [5], [6]. Their implementation is analog in nature.

A novel square-law compander architecture, based on $\Delta$-$\Sigma$ modulation technique for telecom application, is discussed in reference [7]. Authors of this paper claim that proposed compressor and expander circuits reduce the number of off-chip components. However, from FIG. 2 and FIG. 3 one can see that both compressor and expander consist of several analog components.

In reference [8] a novel technique, based on the use of a $\Delta$-$\Sigma$ modulator and operational transconductance amplifier (OTA) is proposed. Even though that implementation of compressor and expander circuit is simple (FIG. 4 in [8]) OTA is an analog circuit. In addition, an adaptive delta modulator is implemented with 6 OTA, 2 diodes, 2 resistors and 3 capacitors (FIG. 2 in [8]). As with a standard operational amplifier, practical OTA's have some non-ideal characteristics, such as input stage nonlinearity at higher differential input voltages, temperature sensitivity of transconductance, variation of input and output impedance with control current, and bias voltages as well.

The $\Delta$-$\Sigma$ based CMOS compander circuit is proposed in [9]. The proposed configuration is a suitable alternative to the conventional compander structures. However, the proposed compander's envelope detector circuit is complex (FIG. 6 in [9]). It is implemented with switch capacitor (SC) technology and the entire compander operates at 500 kHz.

Almost all digital implementation of a square law compander is proposed in [10]. In addition to a RC low-pass filter there are two comparators.

Adaptive $\Delta$-$\Sigma$ modulation system is proposed by Mandell (U.S. Pat. No. 4,940,977). This system comprises of 10 building blocks. Nine of these blocks are analog circuits, except D flip-flop. Their complexity is overwhelming and analog processing is achieved by five analog filters, analog rectifier and one analog exponential circuit. Mandel claims that adaptation-control is achieved using information contained in a digital bit-stream. This is not new. There are many adaptive algorithms which explore delta modulated bit-stream in the process of adaptation [17], [18], [19]. In addition, Mandel stated that delta-modulator adaptation-control circuits typically employing techniques similar to those used in control circuits of analog audio compressors or expanders. Even though this may be accurate, one must have in mind that the compression is a highly nonlinear process which introduces distortion of signal at higher input levels [17], [18], [19]. In the literature of adaptive delta modulators, the word companding is frequently used [17]. Adaptive step size is derived from the delta modulated bit-stream. For example, if 4 consecutive "zeros" or "ones" are detected, this is indication that feed-back signal is not following input signal, and appropriate action must be undertaken. This action depends on the type of adaptation algorithm [17]. One must have in mind that transfer function of adaptive modulator ($V_{feedback}$=F (Vin)) is a linear function, while transfer function of a compressor is highly nonlinear. Thus, feedback signal of an adaptive modulator must closely follow an input signal. The transfer function of the compressor, which is the subject of this invention, is nonlinear and feedback signal does not follow closely the input signal.

BRIEF SUMMARY OF THE INVENTION

This invention introduces a novel delta-sigma based square-law compander circuit, which consists of a second-order delta-sigma modulator, compressor and expander circuits. Operation of both compressor and expander is based on the operation of a rectifying encoder (RE) [11].

The operation of the proposed circuits will be apparent upon consideration of the following detailed description, taken in conjunction with the accompanying drawings. The present invention includes four independent apparatus (circuits):

1. An apparatus for square-low compression of an analog signal.
2. An apparatus for expanding operations of a compressed signal.
3. An apparatus for companding (a back-to-back connection of the compressor-expander circuits).
4. An apparatus for post-processing of the compressed Δ-Σ bit-stream.

It is, therefore, a primary objective of the present invention to provide a circuit for compression of an analog signal based on a higher order Δ-Σ ADC.

It is still objective of the present invention to provide a circuit for expanding compressed digital signal.

It is further objective of the present invention to provide a circuit for expanding an analog signal with the use of a second-order Δ-Σ modulator as an ADC.

Yet another objective of the present invention is to provide a system (circuits) for post-processing of a compressed second-order Δ-Σ bit-stream.

Finally, it the objective of the present invention to design a system on a chip (SoC) which includes a multiplexed sensor array, a second-order (or higher-order) Δ-Σ ADC, a compressor, and an expander, with a capacitor as a possible external element to an IC.

DETAILED DESCRIPTION OF THE INVENTION

Definition

A compander consists of compressor and expander circuits. It is an essential part in the telecommunication industry (telephony, TV, radio) and the sound recording industry. A compressor is used to reduce a dynamic the range of the signal (makes a quiet signal louder). The dynamic range of the signal is defined as a ratio of an amplitude of loud and quiet signal ($D=V_{max}/V_{min}$). For example, a dynamic range of a voice signal is 1,000:1 (about 60 dB in average). The expander reverses the process and makes a signal quiet again (expands the dynamic range). Both processes are highly nonlinear. Transfer function of the expander is a parabola ($Vo=(Vin)^2$), and of compressor is $Vo=$square root$(Vin)$. A compressor introduces signal distortion at higher input levels. The inverse function of expander generates a final output signal without distortion. Implementation of both processes is based on a non-conventional use of a Δ-Σ modulation and nonlinear processing of its bit-stream.

The Best Mode of Invention

The block diagram of the circuits with supporting simulation results are presented; herein shall be presented as the best mode contemplated by the inventor.

How to Make the Invention

As can be amply seen from the drawings, every circuit presents an independent invention. Thus, it is necessary to describe every invention separately.

Figure 1:
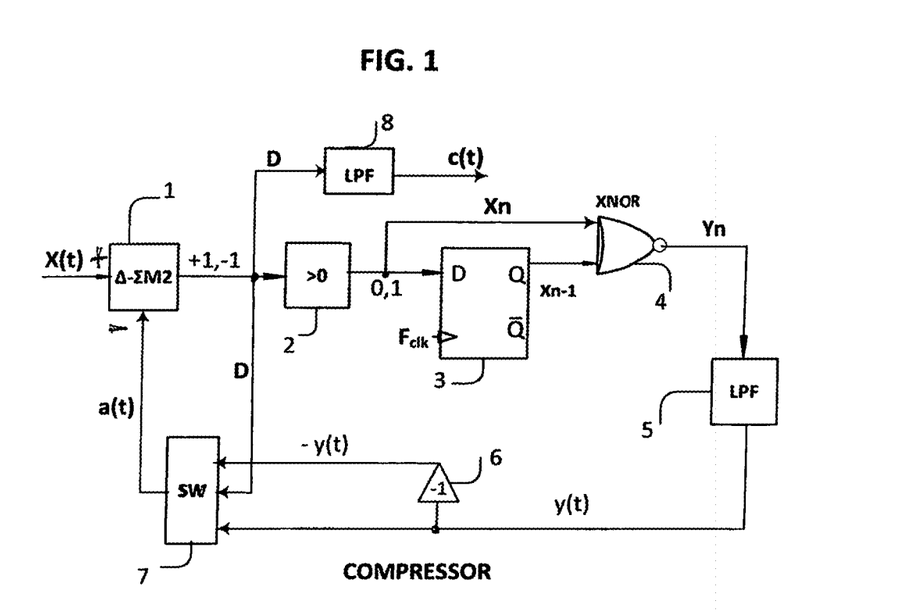
FIG. 1 shows a block diagram of the compressor circuit.

FIG. 1 shows a block diagram of a square-law compressor circuit. Analog input signal x(t) is delta-sigma modulated using a second order Δ-Σ modulator (1). Polar digital bit-stream D is rectified (2) to produce unipolar bit-stream $X_n$ of "zeros" and "ones". This signal is delayed in a D flip-flop (3) for one clock period to produce delayed signal $X_{n-1}$. Both $X_n$ and $X_{n-1}$ are delivered to the XNOR gate (4) to produce a rectified Δ-Σ bit-stream $Y_n$. Bit stream $Y_n$ is low-pass filtered (LPF) in (5). Output of LPF (y(t)), is inverted in (6), and modulated by the polar Δ-Σ bit-stream D in SW (7), to produce amplitude modulated (AM) signal a(t). This signal is fed back to the input of the second-order Δ-Σ modulator to produce compressed Δ-Σ bit-stream D. One can see that the compressor presents a negative feedback closed loop system. It can be used as independent stand-alone system, or in some applications in combination with the expander.

Figure 2:
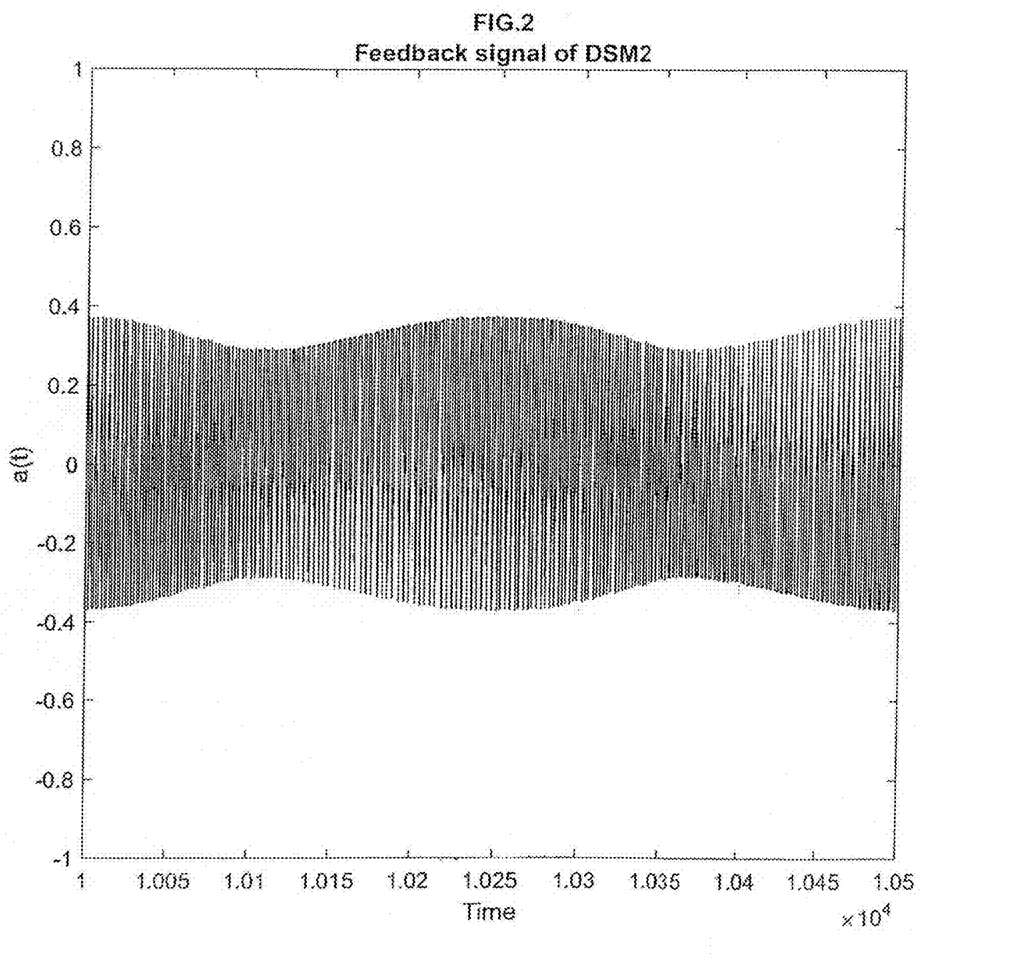
FIG. 2 shows an amplitude modulated signal a(t).

FIG. 2 shows AM signal a(t). One can clearly see embedded signal D ("carrier") into the envelope of low-pass signal y(t).

Figure 3:
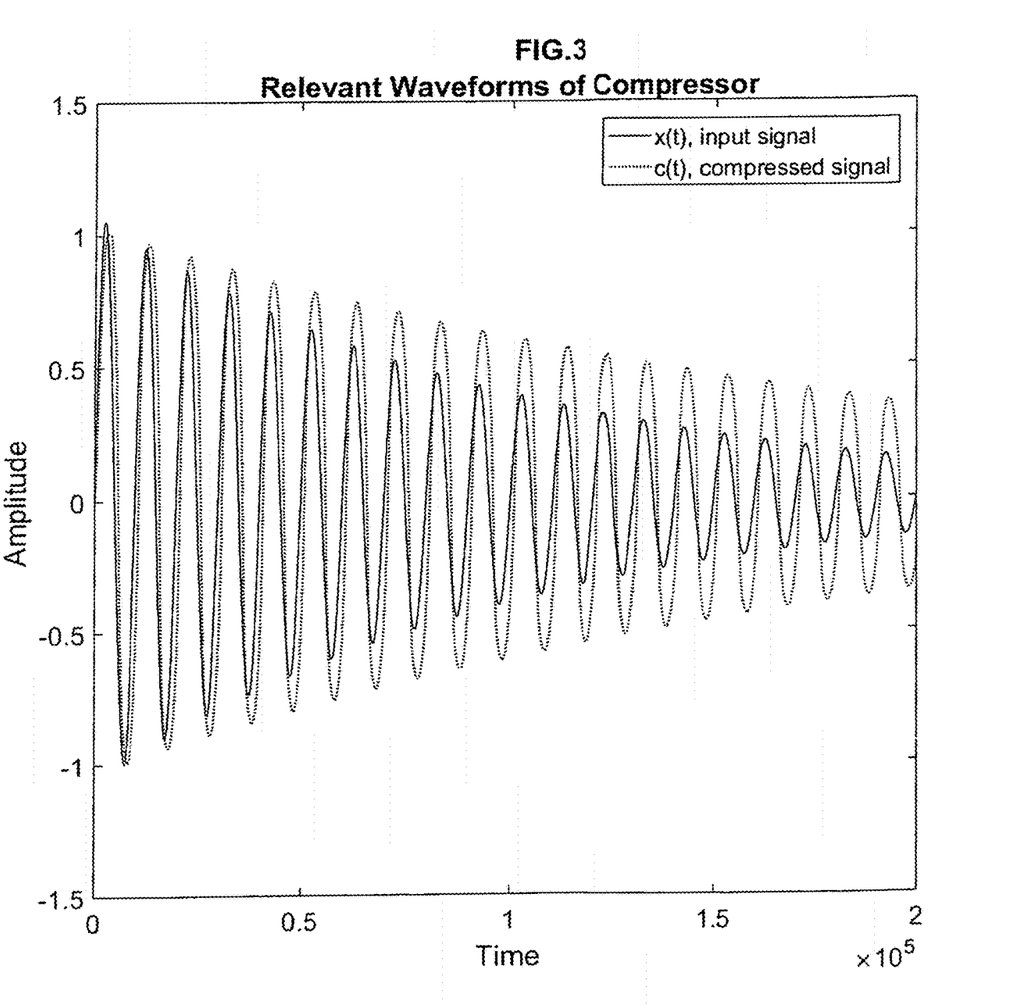
FIG. 3 shows an input signal x(t) and compressed signal c(t).

FIG. 3 shows a relevant waveform of a compressor circuit. Input signal is x(t)=(e^(−t))*sin(ωt), and its compressed version is signal c(t) (which is demodulated polar signal D). One can see a slight compression at higher levels of input signal, while significant increase of amplitude at lower levels of input. Compression ratio is 2:1.

Figure 4:
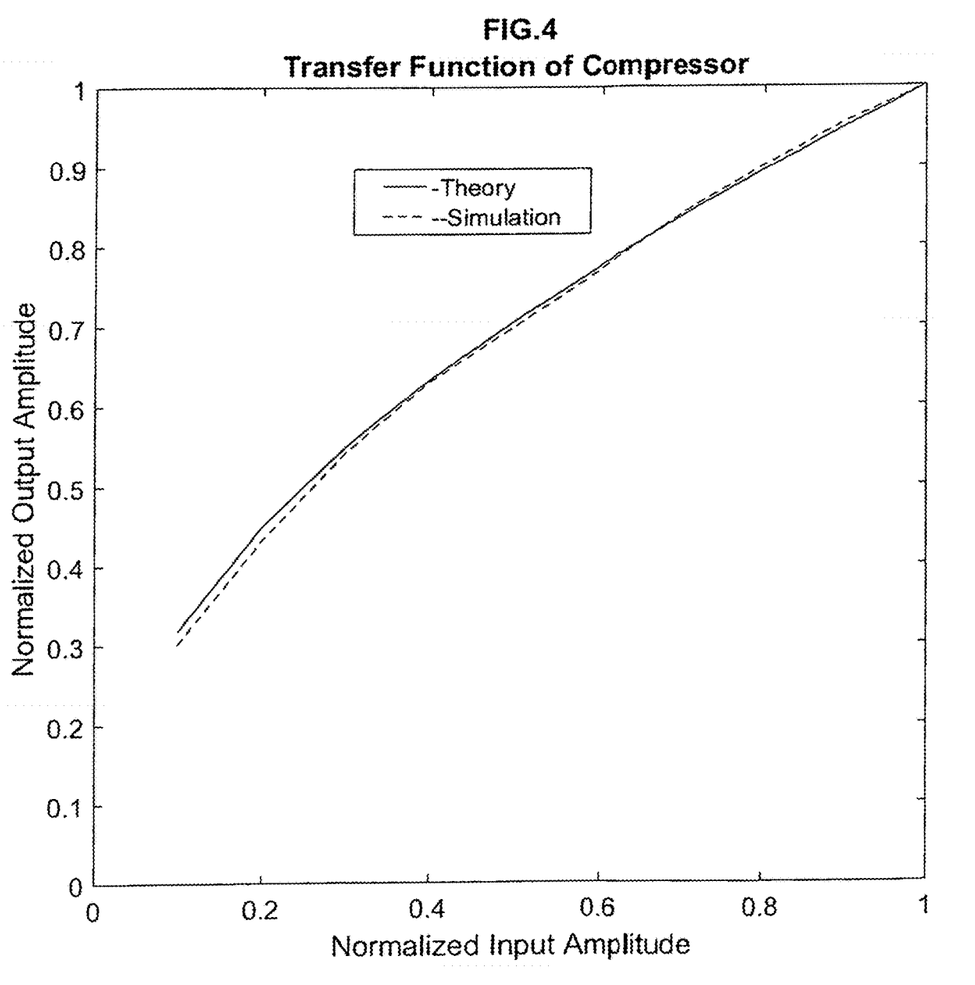
FIG. 4 shows a transfer function of compressor.

FIG. 4 shows a transfer (nonlinear) function of compressor. One can see a closed agreement of simulation with a theoretical nonlinear function, c(t)=sqroot(x(t)).

Figure 5:
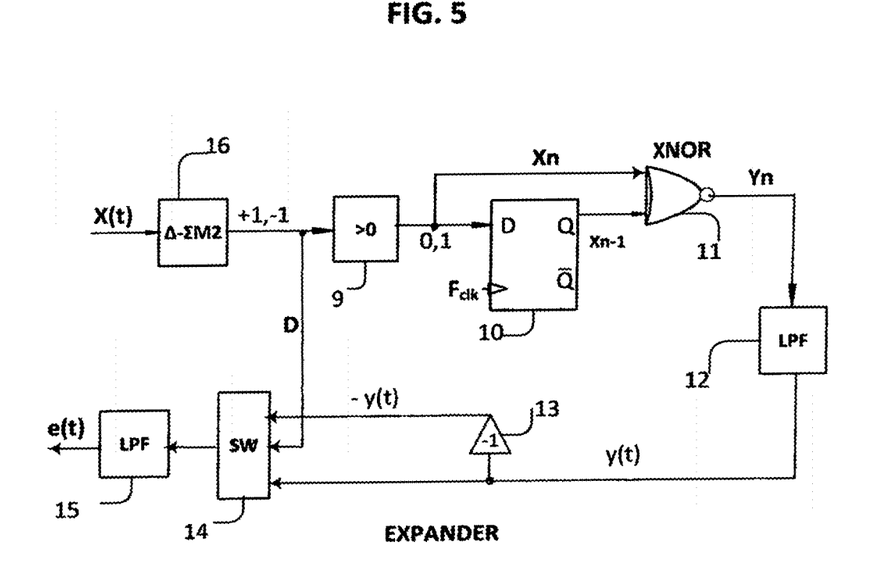
FIG. 5 shows a block diagram of the expander circuit.

FIG. 5 shows a block diagram of a square-law expander circuit. Analog signal x(t) is fed in a second-order Δ-Σ modulator (16). Its output polar bit-stream is rectified to obtain unipolar bit stream $X_n$. Both $X_n$ and delayed bit-stream $X_{n-1}$ are fed into XNOR gate (11) to obtain rectified bit-stream $Y_n$. This bit-stream is low-pass filtered (12), and an analog signal y(t) is obtained. Both signal y(t) and −y(t) are fed into multiplying SW (14), and after low-pass filtering (15) expanded signal e(t) is obtained. One can see substantial difference between compressor circuit (FIG. 1) and expander circuit (FIG. 5). Expander circuit is an open loop system (Δ-Σ modulator in FIG. 5 does not have an external negative feedback), while compressor's Δ-Σ modulator has a negative feedback signal a(t). When compressor and expander circuits are connected back-to-back, as in FIG. 8, then no need for Δ-Σ modulator in the expander circuit.

Figure 6:
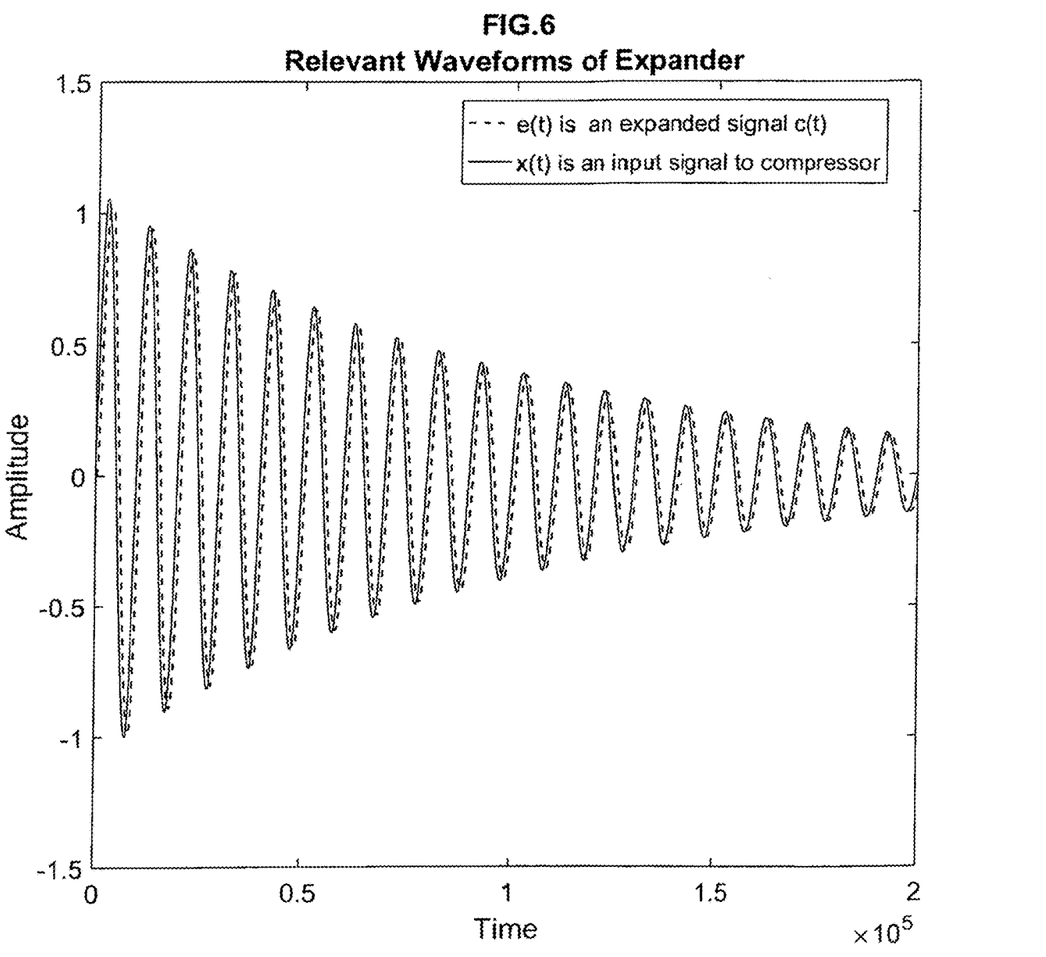
FIG. 6 shows an input signal x(t) and expanded e(t).

FIG. 6 shows the case when compressed signal c(t) (in FIG. 3) is expanded to obtain signal e(t). One can see a good agreement between the original signal x(t) and the expanded signal c(t), which is signal e(t). One notices, a slight delay of signal e(t) because of low-pass filtering process in compressor and expander circuits.

Figure 7:
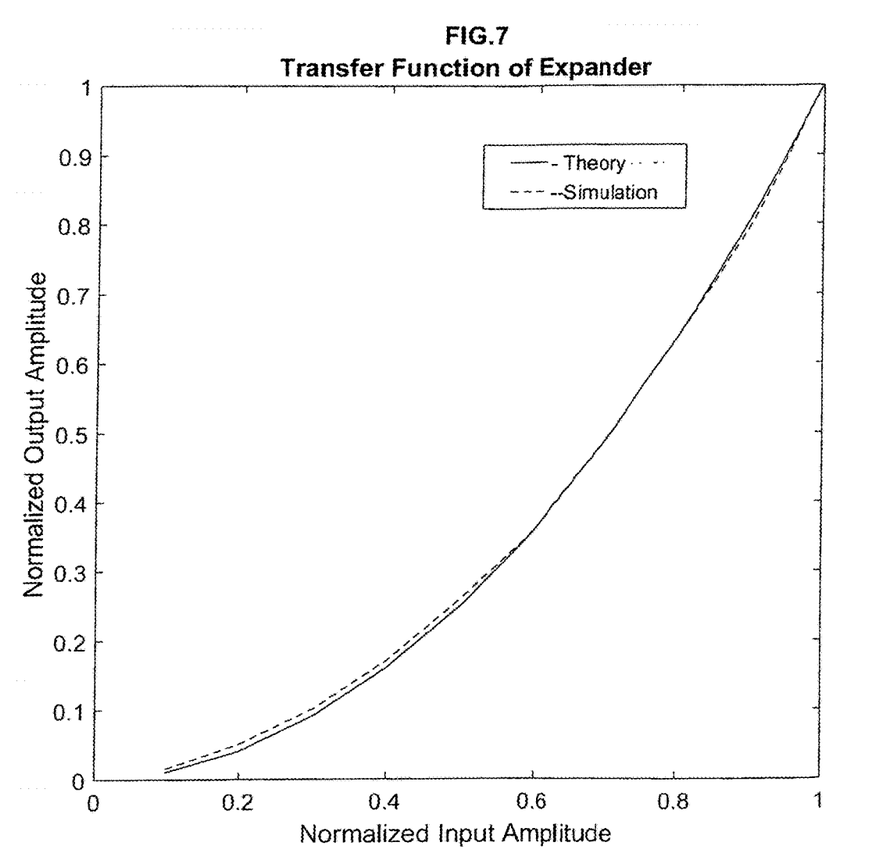
FIG. 7 shows a transfer function of the expander.

FIG. 7 shows the expander's quadratic (nonlinear) transfer function. One sees a close agreement between theoretical (c(t)=x(t)^2), and simulation results.

Figure 8:
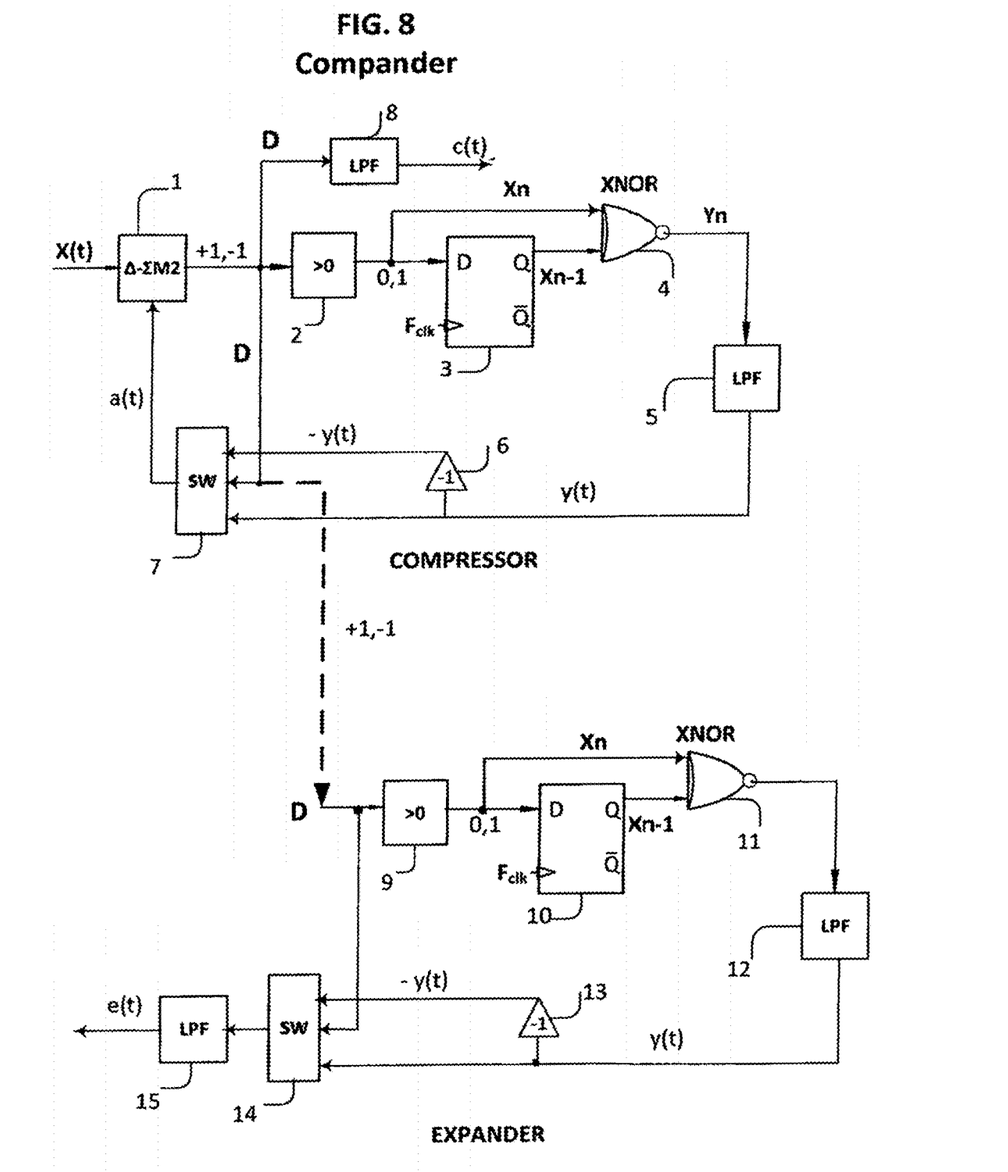
FIG. 8 shows a block diagram of the compander.

FIG. 8 shows a block diagram of the back-to-back connection of compressor and expander circuits. Their operation is described in the preceding paragraphs. This connection presents the compander circuit with possible application in companded pulse code modulation (PCM) systems [17]. Because delta modulated digital signal D is transmitted in a digital form (dashed transmission line) no need for Δ-Σ modulator in expander circuit. A compressed polar bit-stream D is directly connected to the SW (14) and to the comparator circuit (9) to obtain a unipolar bit stream $X_n$.

Figure 9:
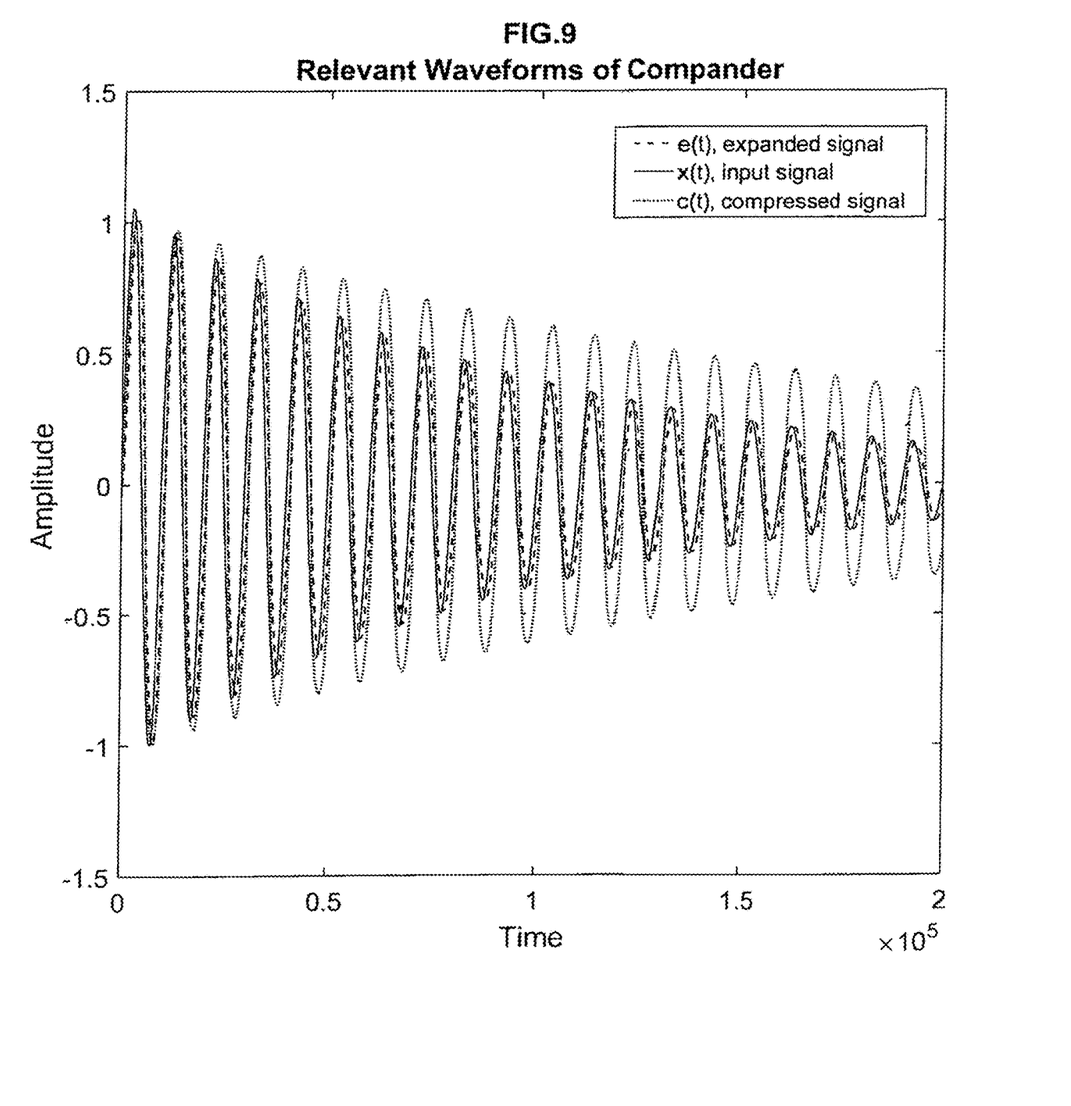
FIG. 9 shows relevant waveforms of the compander.

FIG. 9 shows relevant waveforms of the proposed system for the square-law compander of an analog signal. It is noted that an input signal x(t), after compression, undergoes change where low-level input amplitudes are amplified, while high-level input amplitudes are slightly attenuated (signal c(t)). After expanding compressed bit-stream D, identical signal e(t)=x(t) is obtained.

Figure 10:
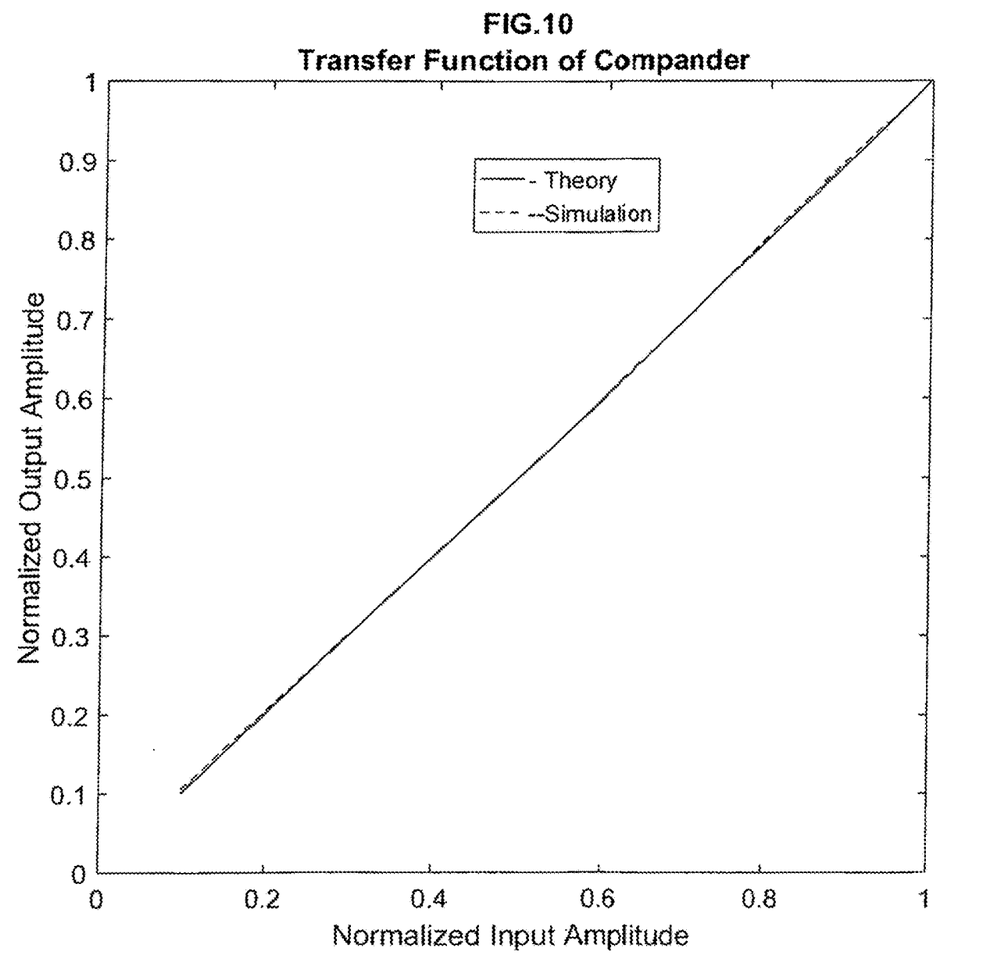
FIG. 10 shows a transfer function of the compander.

FIG. 10 shows an overall transfer function of a compander. There is a close agreement between theory and simulation.

Figure 11:
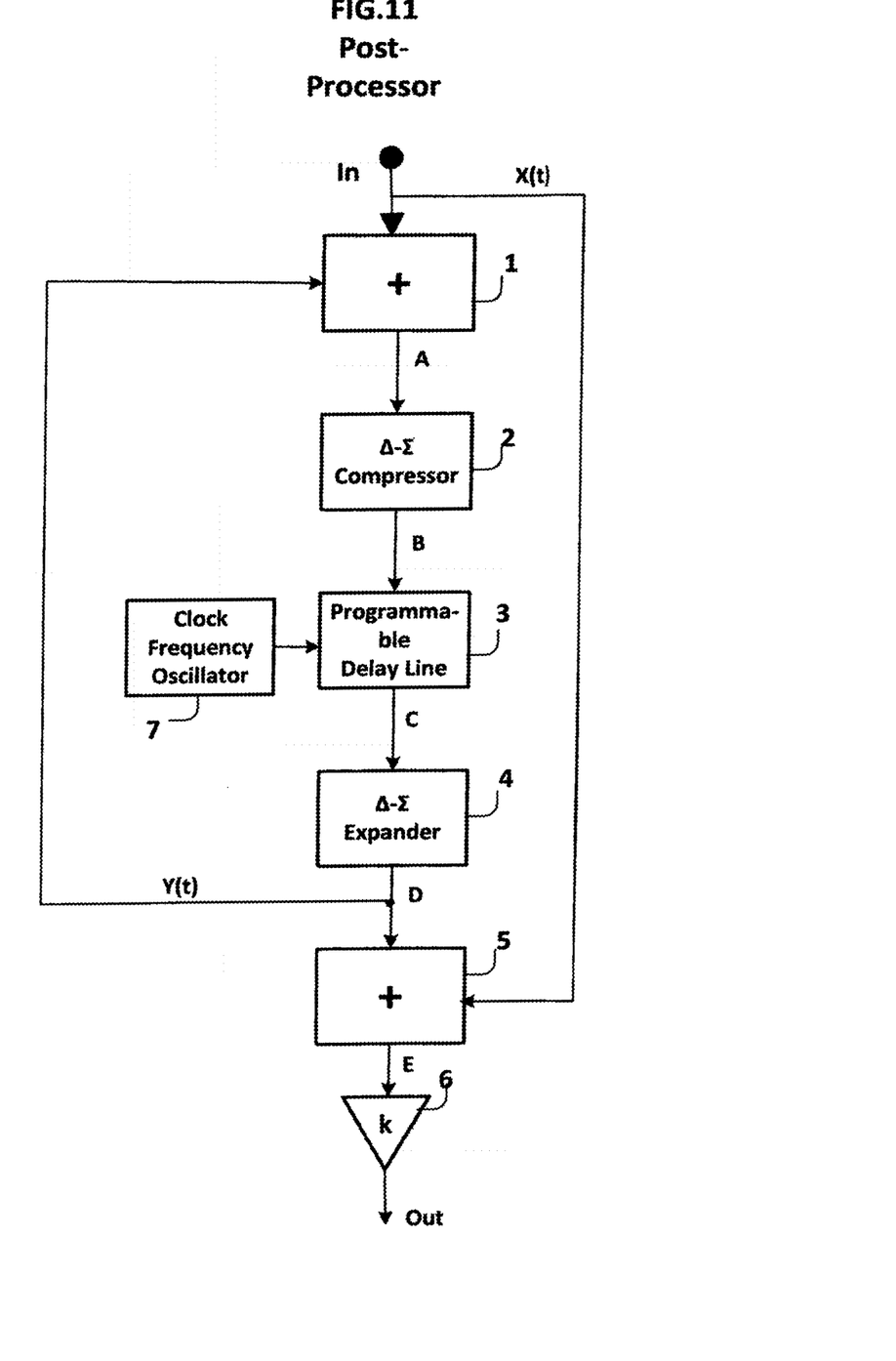
FIG. 11 shows a block diagram of post-processor of a compressed signal.

FIG. 11 shows a block diagram of a companding system for post processing of a compressed signal. The use of the compressor can make pop recordings, or live sound mixes sound musically better by controlling maximum level and maintaining higher average loudness. In addition, it helps in reducing a noise and it can alter a sound signal by introducing a cyclically varying phase shift into one of two identical copies of the signal and recombining them. Companding is used especially in popular music to alter the sound of an instrument. Existing post-processing schemes are too complex, and existing analog lines are prone to noise (Bucket Brigade Devices-BBD) [5], [6]. The proposed post-processing companding system simplifies existing systems by avoiding low-pass filters and BBD analog delay line. The proposed post-processor consists of two analog summing circuits (1) and (5), a Δ-Σ compressor circuit (2), a programmable delay line (3), a Δ-Σ expander circuit (4), clock oscillator, and an amplifier (or an attenuator) (6). A second-order Δ-Σ compressing and expanding circuit is used, but it can be employed any higher-order Δ-Σ modulator. Noteworthy is that the proposed digital post-processing apparatus does not require an analog BBD, a low-pass filter after the compressor and before an expander [5], [6].

Figure 12:
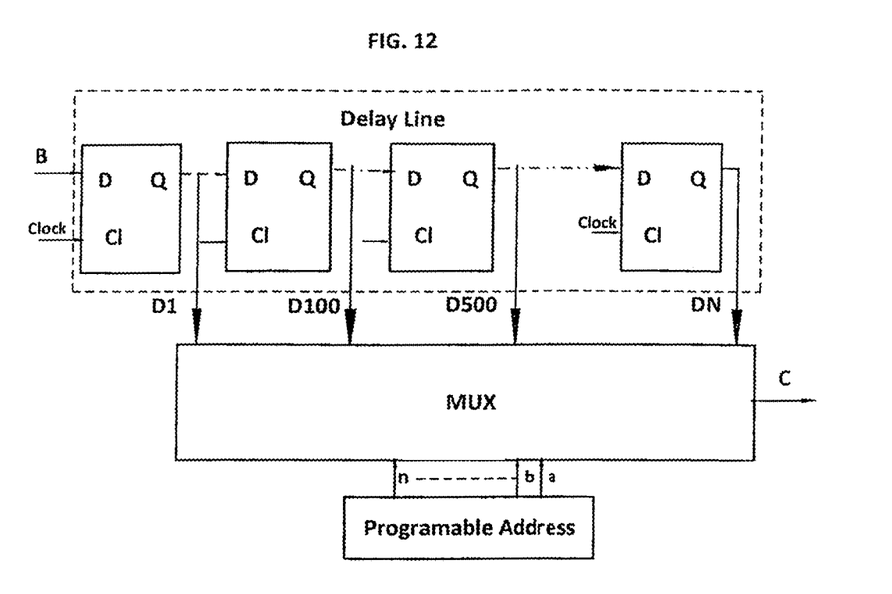
FIG. 12 shows a digital programmable delay line.

FIG. 12 shows a programmable digital delay line, implemented by D flip-flops (n-bit shift register), controlled with a high precision digital clock oscillator. A delay line (3) accepts compressed bit-stream B, and outputs delayed bit-stream C to the Δ-Σ expander (4). Expanded signal y(t) is added to the input signal x(t) in (1) and (5).

How to Use the Invention

The basic idea of an oversampled Δ-Σ modulator, which converts a bandlimited analog signal to a binary pulse train, is to surround a one-bit quantizer with feedback loops. Its operation is well understood and described in published literature [12], [13]. Δ-Σ modulators are known as noise shaping modulators, because a large quantization noise is shaped by the feedback loops in such a way that most of the noise energy is moved out of the baseband to reside at higher frequencies. Even though that the signal and quantization noise share the same pulse train, they occupy a different section of the spectrum. When the modulator is oversampled, the signal and noise sections of the spectrum are wider apart. Thus, the restoration of the signal to its analog form is easier to achieve. Current Δ-Σ modulators can achieve resolution of 24 bit, and signal-to-quantization noise over 100 dB. In addition, Δ-Σ modulators are known as oversampling or pulse density modulators because a density of the ones and zeros in the output binary sequence reflects the ratio between the instantaneous slow changing (relative to the sampling frequency) input signal amplitude and the modulator's reference voltage. Scaling the reference voltage can therefore scale the pulse density. If the reference voltage in a modulator is replaced by another signal, the output pulse density reflects the input signal divided by the reference signal. The modulator, therefore, could be used to perform division [14]. On the other hand, if a Δ-Σ modulator output is used to switch another voltage reference to the input of some sample and hold circuit (which is in effect a demodulator) the resulting output is proportional to the voltage reference being switched. If one replaces this reference with another signal, the result would be the multiplication of two signals. Such an observation has led to an unconventional use of Δ-Σ oversampling for the construction of multiplier less compressors and expanders [7], [8], [9], [14], [15]. Pioneering work of unconventional linear signal processing (addition/subtraction, multiplication by a constant less than one), using Δ-Σ modulation, is first reported by Kouvaras [16]. However, use of nonlinear operations, such as squaring and rectification of a Δ-Σ density bit-stream is a novelty of the proposed inventions. Squaring and rectification operations, performed on a Δ-Σ bit stream, are reported in references [11]. The newly proposed circuits of compression, expansion, companding, and post-processing of compressed signal can be used in numerous applications such as in speech and music processing, telecommunications (telephony), adaptive linearization of a RF power amplifier (PA) using predistortion (compression), automatic gain control AGC), sensor applications, etc. In addition, a one-bit compressed Δ-Σ bit-stream can be easily encrypted/scrambled to add additional difficulty for intended interceptor.

What is claimed is:
1. A compressor apparatus comprising:
a second-order or higher-order delta-sigma modulator;
a comparator to convert bipolar delta modulated bit-stream D into unipolar bit-stream Xn;
a rectifying encoder, which consists of a D flip-flop and XNOR gate, and accept bit-streams $X_n$ and $X_{n-1}$ to produces rectified signal $Y_n$;
a feedback low-pass filter, for filtering (smoothening) a unipolar bit-stream $Y_n$, and produces analog signal y(t);
an analog inverter circuit to invert analog signal y(t), and produce –y(t) signal;
an amplitude modulator whose inputs are high-frequency digital signal D, analog signals y(t), –y(t), and the output signal of the amplitude modulator is a(t), which goes to the negative input of the Δ-Σ modulator; and
a low-pass filter for demodulation of a compressed bit-stream D.

2. An expander apparatus comprising:
a second-order or higher-order delta-sigma modulator;
a comparator to convert bipolar delta modulated bit-stream into unipolar bit-stream;
a rectifying encoder, which consists of a D flip-flop and XNOR gate;
a low-pass filter for smoothing unipolar digital signal $Y_n$;
an analog inverter circuit to invert analog signal y(t), and produce –y(t) signal;
an amplitude modulator with inputs D, y(t), –y(t); and
a low-pass filter to smooth the output of the amplitude modulator, and produce filter out expanded signal e(t).

3. A compandor apparatus comprising:
a compressor of claim 1, whose analog input signal is x(t), produces a polar compressed bit-stream D; and
an expander of claim 2, whose input is directly connected to delta-modulated output of compressor (signal D) and produces expanded signal e(t)=x(t).

4. An apparatus for post-processing of a compressed digital bit-stream comprising:
- an input summing circuit to add analog input signal x(t) and analog feedback signal y(t);
- a delta-sigma compressor of claim 1, to compress the sum of two analog signals;
- a programmable digital delay line to create different acoustic effects;
- a clock oscillator;
- an expander of claim 2 to obtain an analog signal y(t);
- an output summing circuit; and
- an amplifier or attenuator.

\* \* \* \* \*